(12) United States Patent
Park et al.

(10) Patent No.: US 10,461,491 B2
(45) Date of Patent: Oct. 29, 2019

(54) LASER RESONATOR AND LASER RESONATOR ARRAY

(71) Applicant: SAMSUNG ELECTRONICS CO., LTD., Suwon-si (KR)

(72) Inventors: Yeonsang Park, Seoul (KR); Hyochul Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/813,383

(22) Filed: Nov. 15, 2017

(65) Prior Publication Data
US 2018/0226765 A1  Aug. 9, 2018

(30) Foreign Application Priority Data

Feb. 7, 2017  (KR) .................. 10-2017-0016849

(51) Int. Cl.
| | | |
|---|---|---|
| *H01S 3/02* | (2006.01) | |
| *H01S 3/16* | (2006.01) | |
| *H01S 3/08* | (2006.01) | |
| *H01S 3/06* | (2006.01) | |
| *H01S 5/10* | (2006.01) | |
| *H01S 5/04* | (2006.01) | |
| *H01S 5/065* | (2006.01) | |
| *H01S 5/22* | (2006.01) | |
| *H01S 3/091* | (2006.01) | |
| *H01S 5/024* | (2006.01) | |

(Continued)

(52) U.S. Cl.
CPC .............. *H01S 3/091* (2013.01); *H01S 3/025* (2013.01); *H01S 3/0604* (2013.01); *H01S 3/0608* (2013.01); *H01S 3/0627* (2013.01); *H01S 3/08018* (2013.01); *H01S 3/08086* (2013.01); *H01S 3/1628* (2013.01); *H01S 5/1046* (2013.01); *H01S 5/1071* (2013.01); *H01S 5/02469* (2013.01); *H01S 5/041* (2013.01); *H01S 5/0654* (2013.01); *H01S 5/1017* (2013.01); *H01S 5/22* (2013.01); *H01S 5/222* (2013.01); *H01S 5/3412* (2013.01); *H01S 5/4087* (2013.01)

(58) Field of Classification Search
CPC . H01S 3/02; H01S 3/06; H01S 3/0608; H01S 3/08018; H01S 3/1628; H01S 3/0627; H01S 3/16; G02B 6/29338
USPC .................................. 372/94, 45.01
See application file for complete search history.

(56) References Cited

U.S. PATENT DOCUMENTS

| | | |
|---|---|---|
| 8,513,036 B2 | 8/2013 | Kwon et al. |
| 8,723,145 B2 | 5/2014 | Capasso et al. |
| 8,848,756 B2 | 9/2014 | Lee et al. |

(Continued)

OTHER PUBLICATIONS

Liang Feng et al., "Single-mode laser by parity-time symmetry breaking", Science, Nov. 21, 2014, vol. 346, Issue 6212, pp. 972-975. (five (5) pages total).

(Continued)

*Primary Examiner* — Tuan N Nguyen
(74) *Attorney, Agent, or Firm* — Sughrue Mion, PLLC

(57) ABSTRACT

Provided is a laser resonator for generating a laser light by absorbing energy from outside. The laser resonator includes a metal body and a gain medium layer having a ring shape. The gain medium layer of a ring shape may be provided on the metal body and may generate the laser light by a plasmonic effect.

14 Claims, 9 Drawing Sheets

(51) Int. Cl.
  *H01S 5/34* (2006.01)
  *H01S 5/40* (2006.01)

(56) References Cited

U.S. PATENT DOCUMENTS

| | | | |
|---|---|---|---|
| 9,184,553 B2 | 11/2015 | Özyilmaz et al. | |
| 2005/0152430 A1* | 7/2005 | Onishi | H01S 5/18394 372/92 |
| 2010/0111462 A1* | 5/2010 | Bratkovski | B82Y 20/00 385/2 |
| 2011/0266470 A1* | 11/2011 | Yun | G01N 21/645 250/580 |
| 2012/0063478 A1 | 3/2012 | Park | |
| 2012/0281957 A1* | 11/2012 | Chamanzar | B82Y 20/00 385/131 |
| 2013/0070799 A1* | 3/2013 | Lee | H01S 5/1046 372/45.01 |
| 2015/0036234 A1* | 2/2015 | Ben-Yakar | G02B 5/206 359/885 |
| 2016/0178523 A1* | 6/2016 | Nagatomi | B01L 3/5027 422/69 |
| 2016/0365463 A1* | 12/2016 | Lee | H01L 31/02161 |
| 2017/0025813 A1* | 1/2017 | Eden | H01S 3/10092 |
| 2017/0093129 A1 | 3/2017 | Baik et al. | |

OTHER PUBLICATIONS

Soon-Hong Kwon et al. "Supporting Information for Subwavelength plasmonic lasing from semiconductor nanodisk with silver nanopan cavity", Nanon Lett., 2010, vol. 10, No. 9, pp. 3679-3683, DOI:10. 1021/nl1021706. (eight (8) pages total).

* cited by examiner

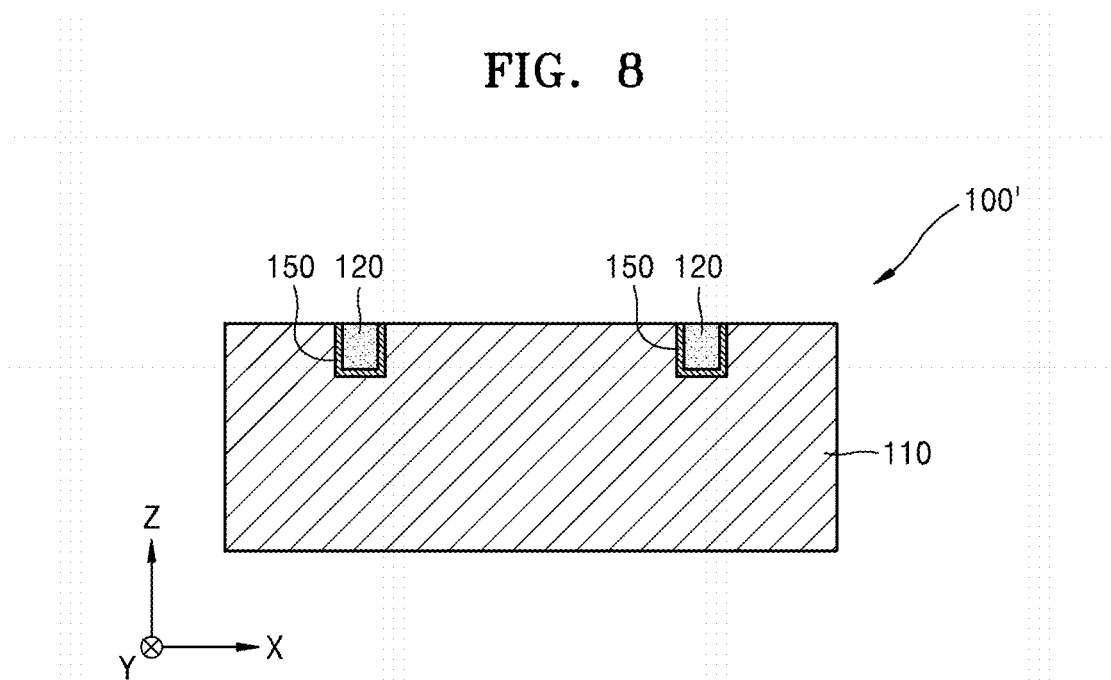
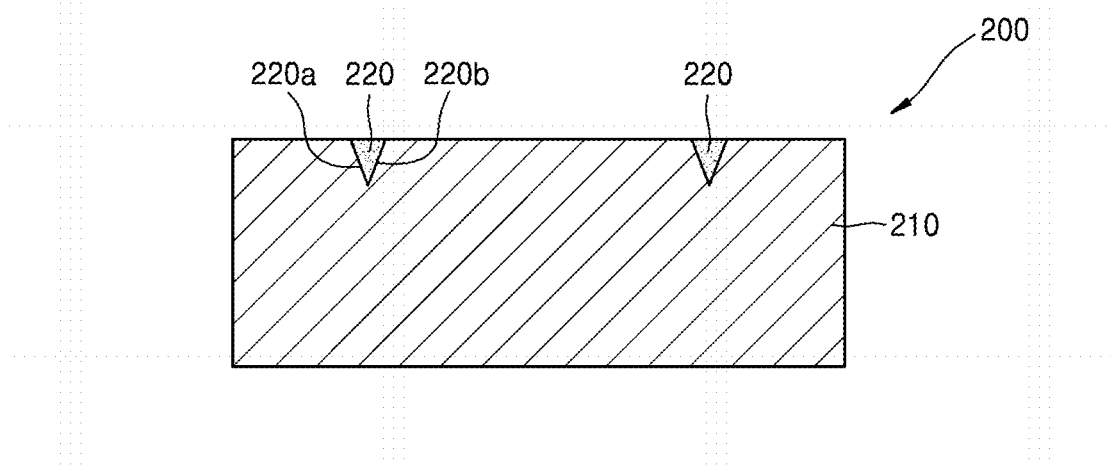

LASER RESONATOR AND LASER RESONATOR ARRAY

CROSS-REFERENCE TO RELATED APPLICATION

This application claims priority from Korean Patent Application No. 10-2017-0016849, filed on Feb. 7, 2017, in the Korean Intellectual Property Office, the disclosure of which is incorporated by reference herein in its entirety.

BACKGROUND

1. Field

The present disclosure relates to a laser resonator and a laser resonator array.

2. Description of the Related Art

In a semiconductor laser device, a semiconductor laser resonator is a core part for obtaining an optical gain. A gain medium generally has a circular disc shape or a rectangular parallelepiped shape. Recently, a technology to implement a semiconductor laser resonator having a size smaller than a wavelength of a laser light by using a plasmonic effect has been developed.

SUMMARY

Provided are methods and apparatuses for a laser resonator including a ring-shaped gain medium layer and a laser resonator array capable of implementing a multi-wavelength by using the laser resonator.

Additional aspects will be set forth in part in the description which follows and, in part, will be apparent from the description, or may be learned by practice of the presented exemplary embodiments.

According to an exemplary embodiment, there is provided a laser resonator comprising: a metal body; and a gain medium layer having a ring shape, comprising a semiconductor material formed on the metal body and configured to generate a laser light by a plasmonic effect. the gain medium layer generates the laser light by absorbing energy from outside the laser resonator.

The gain medium layer may generate the laser light by absorbing energy from outside the laser resonator.

the gain medium layer generates the laser light by absorbing energy from outside the laser resonator.

The gain medium layer may be at least partially embedded into the metal body.

The metal body may further comprise a trench in which the gain medium layer is formed.

A width of the gain medium layer that is defined by a difference between an outer radius of the gain medium layer and an inner radius of the gain medium layer may be equal to or greater than 50 nm.

A laser light of a specific mode may be selected or separated by adjusting a cross-sectional shape of the gain medium layer.

A dielectric layer may be formed between the metal body and the gain medium layer.

The laser resonator may further comprise at least one absorption member provided in the gain medium layer.

The gain medium layer may further comprise a base portion and at least one protruding portion protruding from an upper surface of the base portion.

The at least one protruding portion may further comprise a first protruding portion and a second protruding portion, and the at least one absorption member is provided between the first protruding portion and the second protruding portion.

The at least one absorption member may further comprise a metal material.

A laser light of a specific mode may be selected or separated by adjusting at least one of a number and position of the at least one absorption member.

According to another exemplary embodiment, there is provided a laser resonator array comprising: a metal body; and a plurality of gain medium layers, each having a ring shape, comprising a semiconductor material formed on the metal body and configured to generate lasers light of different wavelength by a plasmonic effect.

The metal body may comprise a plurality of trenches in which each of the plurality of gain medium layers are respectively formed.

A width of each of the plurality of gain medium layers that is defined by a difference between an outer radius of a respective gain medium layer and an inner radius of the respective gain medium layer may be equal to or greater than about 50 nm.

A laser light of a specific mode may be selected or separated by adjusting a cross-sectional shape of each of the plurality of gain medium layers.

A dielectric layer may be formed between the metal body and each of the plurality of gain medium layers.

The laser resonator array may further comprise at least one absorption member provided in each of the plurality of gain medium layers.

Each of the plurality of gain medium layers may comprise a base portion and at least two protruding portions protruding from an upper surface of the base portion, and the at least one absorption member may be provided between the at least two protruding portion.

A laser light of a specific mode may be selected or separated by adjusting at least one of a number and position of the at least one absorption member.

BRIEF DESCRIPTION OF THE DRAWINGS

These and/or other aspects will become apparent and more readily appreciated from the following description of the exemplary embodiments, taken in conjunction with the accompanying drawings in which:

FIG. 8 is a cross-sectional view of a laser resonator according to another exemplary embodiment;

FIG. 9 is a cross-sectional view of a laser resonator according to another exemplary embodiment;

DETAILED DESCRIPTION

Figure 1:
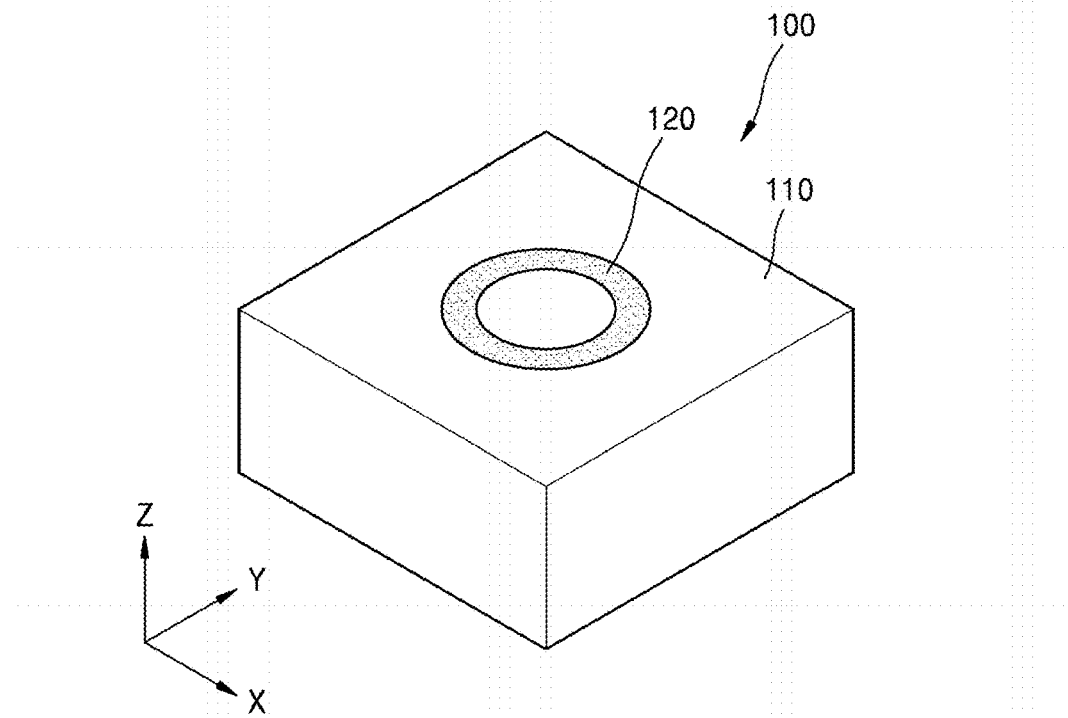
FIG. 1 is a perspective view of a laser resonator according to an exemplary embodiment.

Reference will now be made in detail to exemplary embodiments, examples of which are illustrated in the accompanying drawings, wherein like reference numerals refer to like elements throughout. Also, the size of each layer illustrated in the drawings may be exaggerated for convenience of explanation and clarity. In this regard, the present exemplary embodiments may have different forms and should not be construed as being limited to the descriptions set forth herein. Accordingly, the exemplary embodiments are merely described below, by referring to the figures, to explain aspects of the present description. In a layer structure, when a constituent element is disposed "above" or "on" to another constituent element, the constituent element may be only directly on the other constituent element or above the other constituent elements in a non-contact manner.

Figure 2:
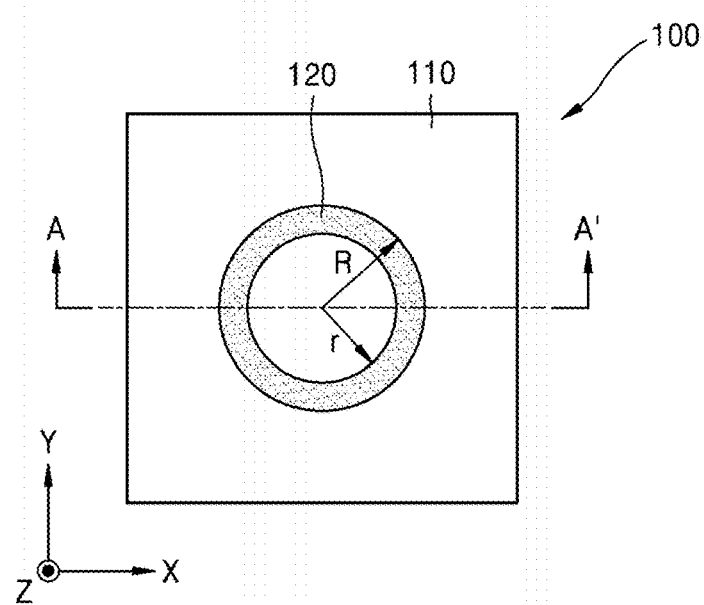
FIG. 2 is a plan view of the laser resonator of FIG. 1 according to an exemplary embodiment.
Figure 3:
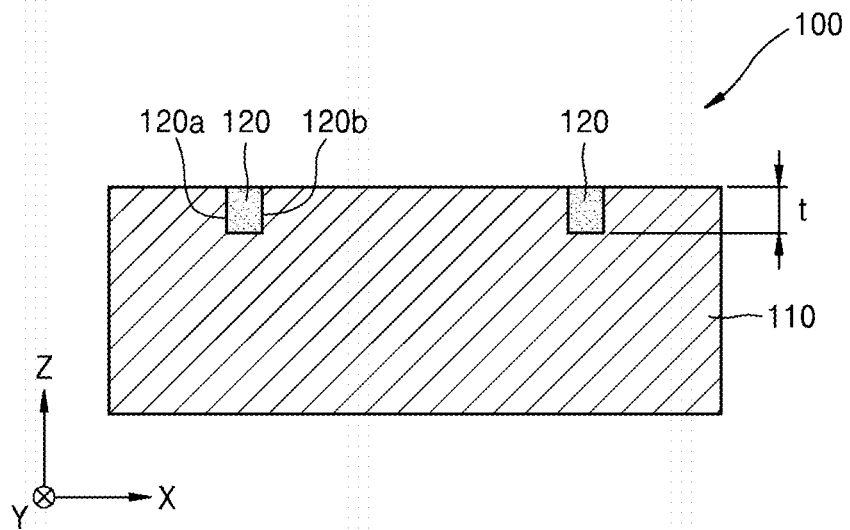
FIG. 3 is a cross-sectional view taken along a line A-A' of FIG. 2 according to an exemplary embodiment.
Figure 4:
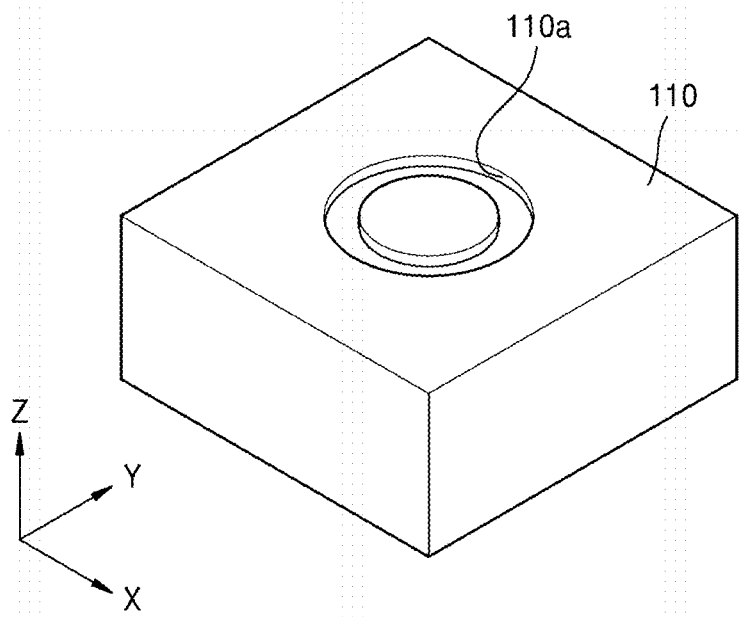
FIG. 4 is a perspective view of a metal body of the laser resonator of FIG. 1 according to an exemplary embodiment.
Figure 5:
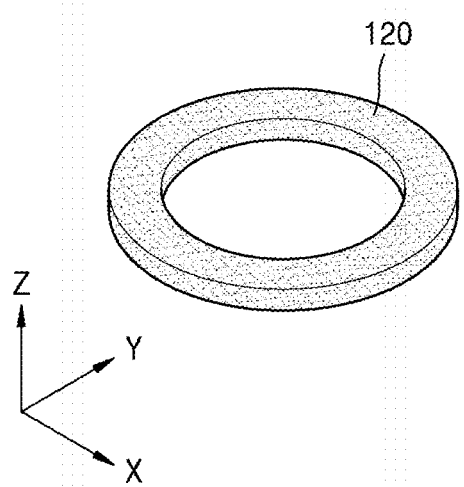
FIG. 5 is a perspective view of a gain medium layer of the laser resonator of FIG. 1 according to an exemplary embodiment.

FIG. 1 is a perspective view of a laser resonator 100 according to an exemplary embodiment. FIG. 2 is a plan view of the laser resonator 100 of FIG. 1. FIG. 3 is a cross-sectional view taken along a line A-A' of FIG. 2. FIG. 4 is a perspective view of a metal body 110 of the laser resonator 100 of FIG. 1. FIG. 5 is a perspective view of a gain medium layer 120 of the laser resonator 100 of FIG. 1.

Referring to FIGS. 1 to 5, the laser resonator 100 may include the metal body 110 and the gain medium layer 120 provided on the metal body 110. The laser resonator 100 may generate a laser light by absorbing energy from outside the laser resonator.

The metal body 110 may include, for example, noble metal. As a detailed example, the metal body 110 may include Al, Ag, Au, or Cu. However, this is merely exemplary and the metal body 110 may include various other metal materials. The metal body 110 may effectively confine the laser light generated by the gain medium layer 120 to be inside the gain medium layer 120.

The gain medium layer 120 provided in the metal body 110 may generate a laser light by absorbing energy by optical pumping or electric pumping and may include a semiconductor material. The gain medium layer 120 may have a ring shape. As illustrated in FIG. 4, a ring-shaped trench 110a corresponding to the shape of the gain medium layer 120 may be formed to a certain depth on one surface, for example, an upper surface, of the metal body 110. The gain medium layer 120 may be provided in the trench 110a.

The gain medium layer 120 may include an active layer (not shown) including a semiconductor material. The active layer may include, for example, a group III-V semiconductor material or a group II-VI semiconductor material. Furthermore, the active layer may include quantum dots. As a detailed example, the active layer may include a multi-quantum well including InGaAs, AlGaAs, InGaAsP, or AlGaInP, but the present disclosure is not limited thereto. The gain medium layer 120 may further include upper and lower clad layers (not shown) respectively provided above and under the active layer. Each of the upper and lower clad layers may include an n-type or p-type semiconductor material.

The ring-shaped gain medium layer 120 provided on the metal body 110 may generate a laser light by using a plasmonic effect. The plasmonic effect may refer to a phenomenon that electromagnetic waves and plasmons are coupled on a boundary between metal and a dielectric, generating optical absorption, and thus an electric field that is very increased locally is generated. The plasmon may refer to a quasi-particle that is a collective oscillation of free electrons in metal.

The ring-shaped gain medium layer 120 may have a width smaller than the wavelength of a laser light in order to generate the plasmonic effect. The width of the gain medium layer 120 may be defined by a difference between an outer radius R and an inner radius r of the gain medium layer 120. For example, the width of the gain medium layer 120 to generate the plasmonic effect may be more than about several tens of nanometers, in detail, equal to or greater than 50 nm. Furthermore, the width of the gain medium layer 120 may be equal to or less than ½ of the wavelength of a laser light. For example, when the wavelength of a laser light is about 600 nm, the width of the gain medium layer 120 may be about 50 nm to about 300 nm. However, the present disclosure is not limited thereto.

An outer diameter 2R of the gain medium layer 120 may be, for example, about several hundreds of nanometers to about several micrometers, but the present disclosure is not limited thereto. Furthermore, a thickness t of the gain medium layer 120 may be about several tens of nanometers to about several hundreds of nanometers, but the present disclosure is not limited thereto.

The cross-section of the gain medium layer 120 may have, for example, a rectangular shape, as illustrated in FIG. 3. In this case, opposite sides 120a and 120b of the gain medium layer 120 may be formed perpendicular to the upper surface of the metal body 110. As described below, by adjusting the cross-sectional shape of the gain medium layer 120, a laser light of a desired specific mode may be selectively extracted.

Figure 6A:
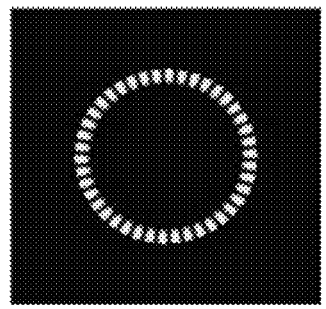
FIGS. 6A and 6B show simulation results of an intensity distribution of an electric field of a laser light generated by the gain medium layer of the laser resonator of FIG. 1, which is viewed on an x-y plane according to an exemplary embodiment.
Figure 6B:
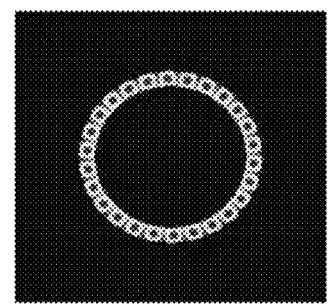
Figure 7A:
FIGS. 7A and 7B show simulation results of an intensity distribution of an electric field of a laser light generated by the gain medium layer of the laser resonator of FIG. 1, which is viewed on an x-z plane according to an exemplary embodiment.
Figure 7B:

FIGS. 6A and 6B show simulation results of an intensity distribution of an electric field of a laser light generated by the gain medium layer 120 of the laser resonator 100 of FIG. 1, which is viewed on an x-y plane. 7A and FIG. 7B show simulation results of an intensity distribution of an electric field of a laser light generated by the gain medium layer 120 of the laser resonator 100 of FIG. 1, which is viewed on an x-z plane. According to the simulations, the intensity of an electric field of the laser light generated by the gain medium layer 120 appears to increase toward a dark portion. Silver (Ag) was used for the metal body 110, and quantum dots were used for the gain medium layer 120. The outer radius R of the gain medium layer 120 was 1.5 μm, and the width of the gain medium layer 120 was 300 nm. The thickness t of the gain medium layer 120 was 250 nm.

FIG. 6A illustrates a laser light of a plasmonic mode generated by the plasmonic effect, and FIG. 6B illustrates a laser light of a photonic mode. Referring to FIGS. 6A and 6B, it can be seen that a laser light of a plasmonic mode and a laser light of a photonic mode are formed in the gain medium layer 120 of the laser resonator 100 of FIG. 1. Each of the laser light of a plasmonic mode and the laser light of a photonic mode may have a different single wavelength. In detail, the laser light of a plasmonic mode may have a wavelength of 616.869 nm, and the laser light of a photonic mode may have a wavelength of 624.029 nm.

FIG. 7A illustrates the laser light of a plasmonic mode, and FIG. 7B illustrates the laser light of a photonic mode. Referring to FIG. 7A, it can be seen that, in the plasmonic mode, the intensity of an electric field is maximum at a position under the gain medium layer 120, and in the photonic mode, the intensity of an electric field is maximum at a center portion of the gain medium layer 120.

As such, when the ring-shaped gain medium layer 120 has a rectangular cross-section, the laser light of a plasmonic mode and the laser light of a photonic mode having different wavelengths are generated. As described below, by adjusting the cross-sectional shape of the gain medium layer 120, a laser light of a single mode having a specific wavelength may be generated by selecting any one of the plasmonic mode and the photonic mode.

FIG. 8 is a cross-sectional view of a laser resonator 100' according to another exemplary embodiment. The laser resonator 100' of FIG. 8 is identical to the laser resonator 100 of FIG. 1, except that a dielectric layer 150 is provided between the metal body 110 and the gain medium layer 120.

Referring to FIG. 8, in the laser resonator 100', the dielectric layer 150 is provided between the metal body 110 and the gain medium layer 120. The dielectric layer 150 may have a thickness of, for example, equal to or less than 10 nm, but the preset disclosure is not limited thereto. The dielectric layer 150 may prevent the laser light generated by the gain medium layer 120 from being absorbed by the metal body 110, and thus a light emission efficiency may be improved.

FIG. 9 is a cross-sectional view of a laser resonator 200 according to another exemplary embodiment. The laser resonator 200 of FIG. 9 is identical to the laser resonator 100 of FIG. 1, except the cross-sectional shape of a gain medium layer 220.

Referring to FIG. 9, the gain medium layer 220 having a ring shape may have a triangular cross-section. In this case, opposite sides 220a and 220b of the gain medium layer 220 may be inclined with respect to an upper surface of a metal body 210. As such, when the cross-section of the gain medium layer 220 is triangular, a laser light of a single mode may be generated. A dielectric layer (not shown) may be further provided between the metal body 210 and the gain medium layer 220 for the improvement of a light emission efficiency.

Figure 10:
FIG. 10 shows a simulation result of an intensity distribution of an electric field of a laser light generated by the gain medium layer of the laser resonator of FIG. 9, which is viewed on the x-z plane according to another exemplary embodiment.

FIG. 10 shows a simulation result of an intensity distribution of an electric field of a laser light generated by the gain medium layer 220 of the laser resonator 200 of FIG. 9, which is viewed on the x-z plane. FIG. 10 illustrated a single mode, in detail, a laser light of a plasmonic mode. Referring to FIG. 10, when the cross-section of the gain medium layer 220 is triangular, only a laser light of a plasmonic mode having a specific wavelength, that is, a wavelength of 616.869 nm, may be generated.

As such, in the laser resonators 100 and 200, by adjusting the cross-sectional shapes of the gain medium layers 120 and 220 having a ring shape, only a specific mode may be extracted from among a plurality of resonant modes having different wavelengths, and thus a laser light of a single mode having one wavelength may be generated.

Figure 11:
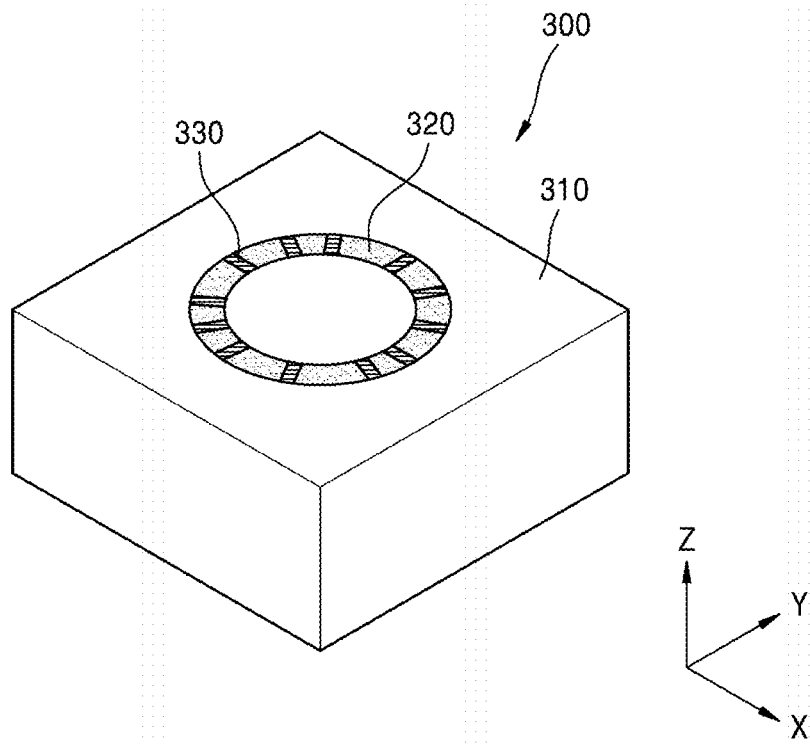
FIG. 11 is a perspective view of a laser resonator according to another exemplary embodiment.
Figure 12:
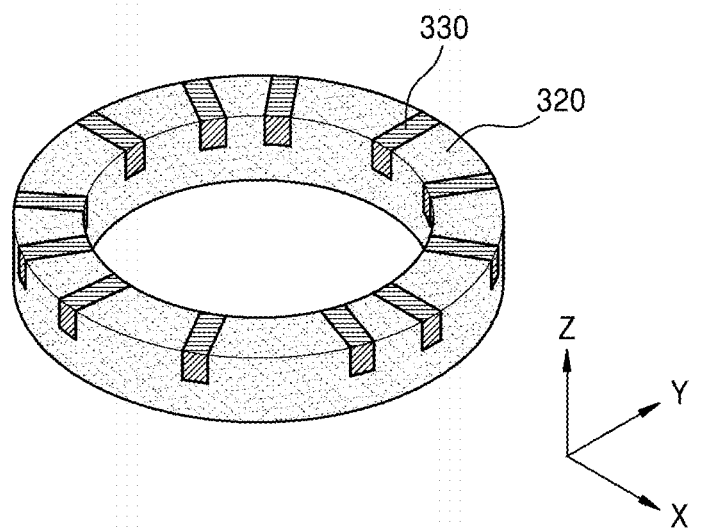
FIG. 12 is a perspective view of a gain medium layer and an absorption member of the laser resonator of FIG. 11 according to another exemplary embodiment.
Figure 13:
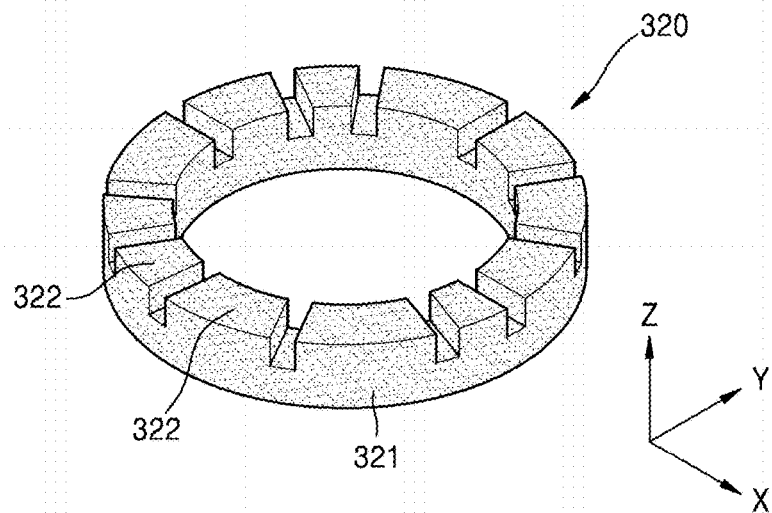
FIG. 13 is a perspective view of the gain medium layer of the laser resonator of FIG. 11 according to another exemplary embodiment.

FIG. 11 is a perspective view of a laser resonator 300 according to another exemplary embodiment. FIG. 12 is a perspective view of a gain medium layer 320 and an absorption member 330 of the laser resonator 300 of FIG. 11. FIG. 13 is a perspective view of the gain medium layer 320 of the laser resonator 300 of FIG. 11.

Referring to FIGS. 11 to 13, the laser resonator 300 may include a metal body 310, the gain medium layer 320 provided on the metal body 310, and at least one absorption member 330 provided in the gain medium layer 320.

The gain medium layer 320 provided in the metal body 310 may generate a laser light by absorbing energy by optical pumping or electric pumping and may include a semiconductor material. The gain medium layer 320 may have a ring shape. A circular trench (not shown) may be formed to a certain depth on one surface, for example, an upper surface, of the metal body 310. The gain medium layer 320 may be arranged in the trench. A dielectric layer (not shown) may be further provided between the metal body 310 and the gain medium layer 320.

The gain medium layer 320 may include an active layer (not shown) including a semiconductor material. The active layer may include, for example, a group III-V semiconductor material, a group II-VI semiconductor material, or quantum dots, but the present disclosure is not limited thereto. The gain medium layer 320 may further include the upper and lower clad layers active layer respectively provided above and under the active layer.

The ring-shaped gain medium layer 320 provided in the metal body 310 may generate a laser light by using the plasmonic effect. To this end, the width of the gain medium layer 320 defined by a difference between the outer radius and the inner radius of the gain medium layer 320 may be smaller than the wavelength of a laser light. For example, the width of the gain medium layer 320 to generate the plasmonic effect may be more than about several tens of nanometers. According to an exemplary embodiment, the width of the gain medium layer 320 may be equal to or greater than 50 nm. Furthermore, the width of the gain medium layer 320 may be equal to or less than ½ of the wavelength of a laser light. The outer diameter of the gain medium layer 320 may be greater than the outer diameter of the gain medium layer 120 of the laser resonator of FIG. 1. Furthermore, the thickness of the gain medium layer 320 may be about several tens of nanometers to about several hundreds of nanometers, but the present disclosure is not limited thereto.

The gain medium layer 320, as illustrated in FIG. 13, may include a base portion 321 and at least one protruding portion 322 provided on an upper surface of the base portion 321. The number and position of the protruding portion 322 may be variously changed according to the number and position of the absorption member 330 that is described later. As illustrated in FIG. 12, the absorption member 330 may be provided between the neighboring protruding portions 322. The absorption member 330 may absorb a laser light of an undesired mode among laser lights of various modes. The absorption member 330 may include, for example, a metal material. However, this is merely exemplary and the absorption member 330 may include various other materials. The absorption member 330 may be integrally formed with the metal body 310. However, without being limited thereto, the absorption member 330 may be provided separately from the metal body 310. At least one of the number and position of the absorption member 330 may be variously changed according to a specific mode to be selected.

In the ring-shaped gain medium layer 120 of FIG. 1, a laser light of a photonic mode and a laser light of a plasmonic mode, each laser light having a single wavelength, is described. In the ring-shaped the gain medium layer having an outer diameter greater than that of the gain medium layer 120 of FIG. 1, each of the photonic mode and the plasmonic mode may include various sub-modes having different wavelengths. In this case, as illustrated in FIG. 12 of the present exemplary embodiment, when a plurality of protruding portions 322 are formed in the gain medium layer 320, and a plurality of absorption members 330 are provided between the protruding portions 322, and thus only a laser light of a single mode having a specific wavelength may be selectively generated. In some exemplary embodiments, one protruding portion 322 may be formed in the gain medium layer 320, and one absorption member 330 may be provided in the protruding portion 322. As described above, as the absorption member 330 provided between the protruding portions 322 absorbs laser lights of undesired modes, only a laser light having a specific wavelength may be generated in the protruding portions 322 of the gain medium layer 320. In this state, by adjusting at least one of the number and position of the absorption member 330, a laser light of a desired specific mode may be selected.

Figure 14:
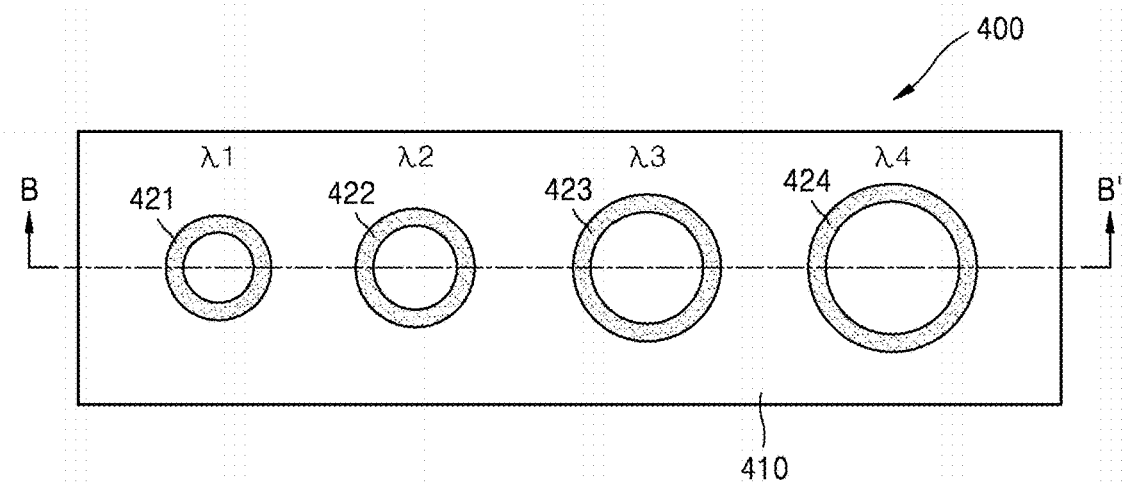
FIG. 14 is a plan view of a laser resonator array according to another exemplary embodiment.
Figure 15:
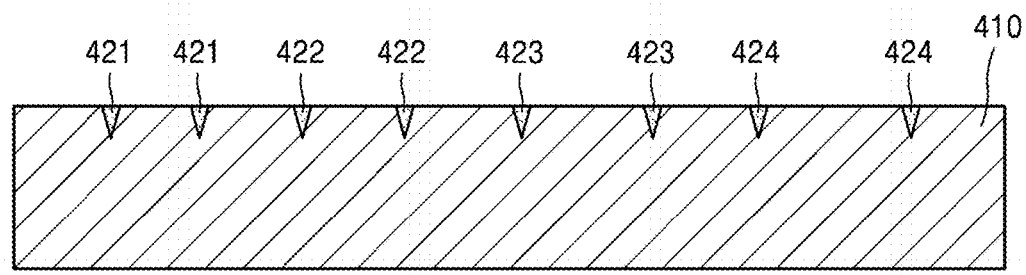
FIG. 15 is a cross-sectional view taken along a line B-B' of FIG. 14.

FIG. 14 is a plan view of a laser resonator array 400 according to an exemplary embodiment. FIG. 15 is a cross-sectional view taken along a line B-B' of FIG. 14.

Referring to FIGS. 14 and 15, the laser resonator array 400 may include a metal body 410 and a plurality of gain medium layers 421, 422, 423, and 424 provided on the metal body 410. The metal body 410 may include, for example, noble metal. As a detailed example, the metal body 410 may include Al, Ag, Au, or Cu. However, this is merely exemplary and the metal body 410 may include various other metal materials.

Each of the gain medium layers 421, 422, 423, and 424 generates a laser light by absorbing energy by optical pumping or electric pumping, and may include a semiconductor material. The gain medium layers 421, 422, 423, and 424 each may include an active layer including a semiconductor material. The active layer may include, for example, a group III-V semiconductor material, a group II-VI semiconductor material, or quantum dots. The gain medium layers 421, 422, 423, and 424 each may further include upper and lower clad layers respectively provided above and under the active layer. Furthermore, for the improvement of a light emission efficiency, a dielectric layer (not shown) may be further provided between the metal body 410 and each of the gain medium layers 421, 422, 423, and 424.

FIGS. 14 and 15 exemplarily illustrate a case in which four gain medium layers, that is, the gain medium layers 421, 422, 423, and 424, are sequentially provided on the metal body 410. However, the present disclosure is not limited thereto, and the number of the gain medium layers 421, 422, 423, and 424 provided on the metal body 410 may be variously changed.

Referring to FIGS. 14 and 15, the first, second, third, and fourth gain medium layers 421, 422, 423, and 424 are sequentially provided on the metal body 410. Each of the first, second, third, and fourth gain medium layers 421, 422, 423, and 424 may generate a laser light of a certain wavelength by the plasmonic effect. Each of the gain medium layers 421, 422, 423, and 424 may have the same shape as the gain medium layer 220 of FIG. 8. Each of the first, second, third, and fourth gain medium layers 421, 422, 423, and 424 may have a ring shape. A plurality of circular trenches (not shown) wherein first, second, third, and fourth gain medium layers 421, 422, 423, and 424 are provided may be formed on an upper surface of the metal body 410.

The width of each of the first, second, third, and fourth gain medium layers 421, 422, 423, and 424 may be smaller than the wavelength of each laser light. For example, the width of each of the first, second, third, and fourth gain medium layers 421, 422, 423, and 424 may be about several tens of nanometers or more, In detail, equal to or greater than 50 nm. Furthermore, the width of each of the first, second, third, and fourth gain medium layers 421, 422, 423, and 424 may be equal to or less than ½ of the wavelength of a laser light. The outer diameter of each of the first, second, third, and fourth gain medium layers 421, 422, 423, and 424 may be, for example, about several hundreds of nanometers to about several micrometers, but the present disclosure is not limited thereto. Furthermore, the thickness of each of the first, second, third, and fourth gain medium layers 421, 422, 423, and 424 may be about several tens of nanometers to about several hundreds of nanometers, but the present disclosure is not limited thereto.

Each of the first, second, third, and fourth gain medium layers 421, 422, 423, and 424 may generate a laser light of a single mode having one wavelength. To this end, each of the first, second, third, and fourth gain medium layers 421, 422, 423, and 424 may have a cross-sectional shape to enable generation of a laser light of a single mode. For example, each of the first, second, third, and fourth gain medium layers 421, 422, 423, and 424 may have a triangular cross-sectional shape.

Furthermore, the first, second, third, and fourth gain medium layers 421, 422, 423, and 424 may generate laser lights having different wavelengths of $\lambda 1, \lambda 2, \lambda 3$, and $\lambda 4$. As such, in order for the first, second, third, and fourth gain medium layers 421, 422, 423, and 424 to generate laser lights having different wavelengths, as illustrated in FIG. 13, the first, second, third, and fourth gain medium layers 421, 422, 423, and 424 may have different outer diameters. However, this is merely exemplary and the laser lights having different wavelengths may be generated by changing the widths or inner diameters of the first, second, third, and fourth gain medium layers 421, 422, 423, and 424.

As described above, as the gain medium layers 421, 422, 423, and 424 each having a ring shape and capable of implementing a single mode are provided in the metal body 410, the laser resonator array 400 for multi-wavelength capable of emitting laser lights of different wavelengths may be manufactured.

Figure 16:
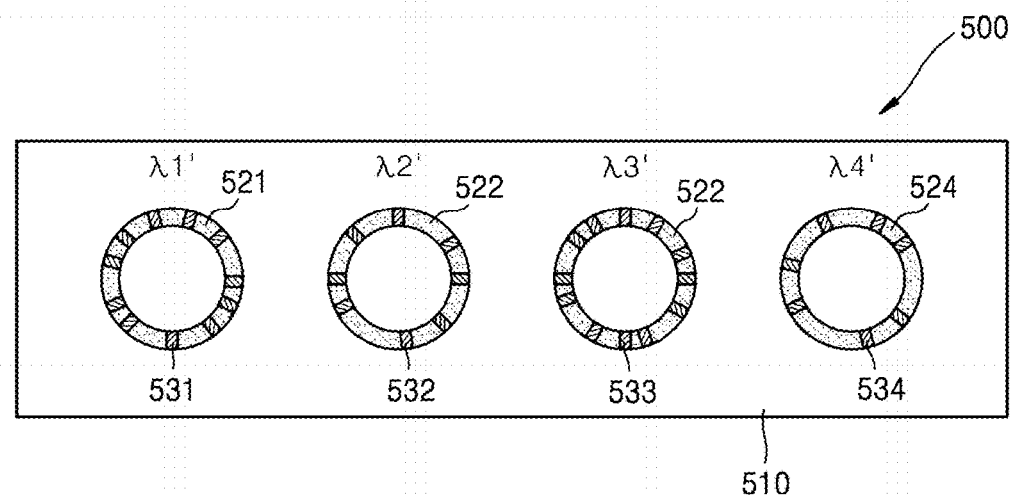
FIG. 16 is a plan view of a laser resonator array according to another exemplary embodiment.

FIG. 16 is a plan view of a laser resonator array 500 according to another exemplary embodiment.

Referring to FIG. 16, the laser resonator array 500 may include a metal body 510, a plurality of gain medium layers 521, 522, 523, and 524 provided on the metal body 510, at least one of absorption members 531, 532, 533, and 534 respectively provided in the gain medium layers 521, 522, 523, and 524.

Each of the gain medium layers 521, 522, 523, and 524 generates a laser light by absorbing energy by optical pumping or electric pumping and may include a semiconductor material. The gain medium layers 521, 522, 523, and 524 each may include an active layer including a semiconductor material. The active layer may include, for example, a group III-V semiconductor material, a group II-VI semiconductor material, or quantum dots. The gain medium layers 521, 522, 523, and 524 each may further include upper and lower clad layers provided above and under the active layer. Furthermore, dielectric layer (not shown) may be further provided between the metal body 510 and each of the gain medium layers 521, 522, 523, and 524.

FIG. 16 exemplary illustrates a case in which four gain medium layers, that is, the gain medium layers 521, 522, 523, and 524, are sequentially provided on the metal body 510. However, the present disclosure is not limited thereto and the number of the gain medium layers 521, 522, 523, and 524 provided on the metal body 510 may be variously changed.

Referring to FIG. 16, the first, second, third, and fourth gain medium layers 521, 522, 523, and 524 are sequentially provided on the metal body 510. Each of the first, second, third, and fourth gain medium layers 521, 522, 523, and 524 may generate a laser light by the plasmonic effect. The first, second, third, and fourth gain medium layers 521, 522, 523, and 524 each may have a ring shape. Furthermore, the width of each of the first, second, third, and fourth gain medium layers 521, 522, 523, and 524 may be equal to or less than ½ of the wavelength of a laser light. Each of the first, second, third, and fourth gain medium layers 521, 522, 523, and 524 may have an outer diameter greater than those of the gain medium layers 421, 422, 423, and 424 of FIGS. 14 and 15. A plurality of circular trenches (not shown) where the first, second, third, and fourth gain medium layers 521, 522, 523, and 524 are provided may be formed on an upper surface of the metal body 510.

Each of the first, second, third, and fourth gain medium layers 521, 522, 523, and 524 may have the same shape as that of the gain medium layer 320 of FIG. 13. In other words, each of the first, second, third, and fourth gain medium layers 521, 522, 523, and 524 may include a base portion (not shown) and at least one protruding portion (not shown) on an upper surface of the base portion. The absorption members 531, 532, 533, and 534 each may be provided between the neighboring protruding portions. In detail, the first, second, third and fourth absorption members 531, 532, 533, and 534 are respectively provided in the first, second, third, and fourth gain medium layers 521, 522, 523, and 524. The first, second, third and fourth absorption members 531, 532, 533, and 534 may absorb laser lights of undesired modes among laser lights of various modes. The first, second, third and fourth absorption members 531, 532, 533, and 534 may be formed integrally with the metal body 510, but the present disclosure is not limited thereto.

The number and position of each of the first, second, third and fourth absorption members 531, 532, 533, and 534 may be variously changed according to a specific mode to be selected. By adjusting at least one of the number and position of each of the first, second, third and fourth absorption members 531, 532, 533, and 534, each of the first, second, third, and fourth gain medium layers 521, 522, 523, and 524 may generate a laser light of a single mode having one wavelength. Furthermore, by adjusting at least one of the number and position of each of the first, second, third and fourth absorption members 531, 532, 533, and 534, the first, second, third, and fourth gain medium layers 521, 522, 523, and 524 may generate laser lights having different wavelengths of λ1', λ2', λ3' and λ4'.

As described above, as the gain medium layers 521, 522, 523, and 524 having a ring shape are provided in the metal body 510 and the absorption members 531, 532, 533, and 534 are respectively provided in the gain medium layers 521, 522, 523, and 524, the laser resonator array 400 for multi-wavelength capable of emitting laser lights of different wavelengths may be manufactured.

According to the above-described exemplary embodiments, a laser resonator including a ring-shaped gain medium layer capable of generating a laser light by the plasmonic effect may be implemented. Furthermore, as the cross-sectional shape of the gain medium layer of the ring-shaped gain medium layer is changed or absorption member for absorbing a laser light of a specific mode is provided in the gain medium layer, only a laser light of a desired single mode may be easily selected. Furthermore, undesired resonant modes may be removed or a desired resonant mode may be effectively separated from other resonant modes. Accordingly, the Q-factor of a laser resonator may be improved.

The laser resonator or laser resonator array capable of easily controlling a resonant mode may be applied to various fields. For example, by implementing a light source with a nano laser resonator, an on-chip photonic IC exhibiting a high speed, a low power, and a compact size may be manufactured. Furthermore, when the nano laser resonator is used as an optical signal transmitting device, high-speed data transmission is possible, and further an optical through-silicon via (TSV) capable of solving a heat problem while transmitting a signal at high speed may be implemented. In addition, the nano laser resonator may be used as a high-precision and high-speed optical clock source that is compatible with CMOS.

It should be understood that exemplary embodiments described herein should be considered in a descriptive sense only and not for purposes of limitation. Descriptions of features or aspects within each exemplary embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A laser resonator comprising:
   a metal body; and
   a ring-shaped gain medium layer having an inner radius and an outer radius, and at least partially embedded into the metal body,
   wherein the ring-shaped gain medium layer is formed of a semiconductor material and configured to generate a laser light through optical absorption by coupling electromagnetic waves and plasmons on a boundary between the metal body and the ring-shaped gain medium layer,
   wherein the laser resonator further comprises at least one absorption member provided in the ring-shaped gain medium layer,
   wherein the ring-shaped gain medium layer comprises a base portion and at least one protruding portion protruding from an upper surface of the base portion and
   wherein a laser light of a specific mode is selected or separated by adjusting at least one of a number and position of the at least one absorption member.

2. The laser resonator of claim 1, wherein the ring-shaped gain medium layer generates the laser light by absorbing energy from outside the laser resonator.

3. The laser resonator of claim 1, wherein the metal body comprises a trench in which the ring-shaped gain medium layer is formed.

4. The laser resonator of claim 1, wherein a width of the ring-shaped gain medium layer that is defined by a difference between an outer radius of the ring-shaped gain medium layer and an inner radius of the ring-shaped gain medium layer is equal to or greater than 50 nm.

5. The laser resonator of claim 1, wherein a laser light of a specific mode is selected or separated by adjusting a cross-sectional shape of the ring-shaped gain medium layer.

6. The laser resonator of claim 1, further comprising a dielectric layer formed between the metal body and the ring-shaped gain medium layer.

7. The laser resonator of claim 1, wherein the at least one protruding portion comprises a first protruding portion and a second protruding portion, and the at least one absorption member is provided between the first protruding portion and the second protruding portion.

8. The laser resonator of claim 1, wherein the at least one absorption member comprises a metal material.

9. A laser resonator array comprising:
a metal body; and
a plurality of ring-shaped gain medium layers, each an inner radius and an outer radius and at least partially embedded into the metal body
wherein the plurality of ring-shaped gain medium layers are formed of a semiconductor material and configured to generate lasers light of different wavelength through optical absorption by coupling electromagnetic waves and plasmons on a boundary between the metal body and respective ones of the plurality of ring-shaped gain medium layers,
wherein the laser resonator array further comprises at least one absorption member provided in each of the plurality of ring-shaped gain medium layers,
wherein each of the plurality of ring-shaped gain medium layers comprises a base portion and at least two protruding portions protruding from an upper surface of the base portion, and the at least one absorption member is provided between the at least two protruding portion, and
wherein a laser light of a specific mode is selected or separated by adjusting at least one of a number and position of the at least one absorption member.

10. The laser resonator array of claim 9, wherein the metal body comprises a plurality of trenches in which each of the plurality of ring-shaped gain medium layers are respectively formed.

11. The laser resonator array of claim 9, wherein a width of each of the plurality of ring-shaped gain medium layers that is defined by a difference between an outer radius of a respective ring-shaped gain medium layer and an inner radius of the respective ring-shaped gain medium layer is equal to or greater than about 50 nm.

12. The laser resonator array of claim 9, wherein a laser light of a specific mode is selected or separated by adjusting a cross-sectional shape of each of the plurality of ring-shaped gain medium layers.

13. The laser resonator array of claim 9, further comprising a dielectric layer formed between the metal body and each of the plurality of ring-shaped gain medium layers.

14. A laser resonator comprising:
a metal body;
a ring-shaped gain medium layer formed of a semiconductor material and configured to generate a laser light through optical absorption by coupling electromagnetic waves and plasmons on a boundary between the metal body and the ring-shaped gain medium layer; and
at least one absorption member provided in the ring-shaped gain medium layer,
wherein the ring-shaped gain medium layer comprises a base portion and at least one protruding portion protruding from an upper surface of the base portion and
wherein a laser light of a specific mode is selected or separated by adjusting at least one of a number and position of the at least one absorption member.

* * * * *